United States Patent
Kigami (10) Patent No.: US 12,120,832 B2
(45) Date of Patent: Oct. 15, 2024

(54) AIR-PERMEABLE MEMBER WITH REMOVABLE PROTECTIVE FILM FOR COVERING VENTILATION HOLE

(71) Applicant: NITTO DENKO CORPORATION, Osaka (JP)

(72) Inventor: Hiroki Kigami, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 463 days.

(21) Appl. No.: 17/442,242

(22) PCT Filed: Mar. 18, 2020

(86) PCT No.: PCT/JP2020/012161
§ 371 (c)(1),
(2) Date: Sep. 23, 2021

(87) PCT Pub. No.: WO2020/196211
PCT Pub. Date: Oct. 1, 2020

(65) Prior Publication Data
US 2022/0159852 A1 May 19, 2022

(30) Foreign Application Priority Data
Mar. 26, 2019 (JP) .................................. 2019-059433

(51) Int. Cl.
*H05K 5/02* (2006.01)
*B01D 63/08* (2006.01)
(Continued)

(52) U.S. Cl.
CPC ......... *H05K 5/0214* (2022.08); *B01D 63/081* (2013.01); *B01D 65/003* (2013.01);
(Continued)

(58) Field of Classification Search
CPC ................ B01D 63/081; B01D 65/003; B01D 69/1071; B01D 71/36; H05K 5/0213; H05K 5/0215
See application file for complete search history.

(56) References Cited

U.S. PATENT DOCUMENTS

| | | |
|---|---|---|
| 2011/0220268 A1 | 9/2011 | Nishio et al. |
| 2013/0074691 A1 | 3/2013 | Furuyama et al. |
| 2020/0148918 A1 | 5/2020 | Inoue et al. |

FOREIGN PATENT DOCUMENTS

| | | |
|---|---|---|
| CN | 102224575 | 10/2011 |
| JP | 9-330940 | 12/1997 |

(Continued)

OTHER PUBLICATIONS

International Search Report issued in International Bureau of WIPO Patent Application No. PCT/JP2020/012161, dated Jun. 16, 2020, along with an English translation thereof.

(Continued)

*Primary Examiner* — Edelmira Bosques
*Assistant Examiner* — Michael James Giordano
(74) *Attorney, Agent, or Firm* — GREENBLUM & BERNSTEIN, P.L.C.

(57) ABSTRACT

A member of the present invention is to be placed to cover a ventilation hole in order to allow passage of gas between an outside and an inside of a housing through the ventilation hole of the housing and prevent dust and/or a liquid from entering the inside from the outside through the ventilation hole. The member of the present invention includes a porous membrane having air permeability in a thickness direction and a provisional protective film joined to the porous membrane to cover the porous membrane from the outside side. The provisional protective film is air-impermeable in a thickness direction or has lower air permeability in the thickness direction than the air permeability of the porous membrane. The provisional protective film and the porous (Continued)

membrane are joined to each other in such a manner that the provisional protective film is removable from the porous membrane.

11 Claims, 5 Drawing Sheets

(51) Int. Cl.
  *B01D 65/00* (2006.01)
  *B01D 69/10* (2006.01)
  *B01D 71/36* (2006.01)
(52) U.S. Cl.
  CPC ......... *B01D 69/1071* (2022.08); *B01D 71/36* (2013.01); *H05K 5/0213* (2013.01)

(56) References Cited

FOREIGN PATENT DOCUMENTS

| JP | 2002-143624 | 5/2002 | |
|---|---|---|---|
| JP | 2011-161359 | 8/2011 | |
| JP | 2012-20279 | 2/2012 | |
| JP | 2018-501972 | 1/2018 | |
| JP | 2018-176748 | 11/2018 | |
| JP | 2018184577 A | * | 11/2018 |
| WO | 2011/068079 | 6/2011 | |
| WO | 2016/100265 | 6/2016 | |

OTHER PUBLICATIONS

Written Opinion of the International Searching Authority issued in International Bureau of WIPO Patent Application No. PCT/JP2020/012161, dated Jun. 16, 2020, along with an English translation thereof.
Lidulard et al., "Engineering Innovation And Robot Technology", Beijing Polytechnic University Press, 7 pages (including translation), May 2013.
Phahd Red et al, "Industrial Robot Technology", West Amsan Electronic Technology University Press, 11 pages (including translation), Mar. 2012.
China Office Action received in CN Application No. 202080024095.4, dated Oct. 12, 2023.
China Office Action received in CN Application No. 202080024095.4, dated Apr. 28, 2023.

* cited by examiner

AIR-PERMEABLE MEMBER WITH REMOVABLE PROTECTIVE FILM FOR COVERING VENTILATION HOLE

TECHNICAL FIELD

The present invention relates to a member for a ventilation hole, the member to be placed to cover a ventilation hole of a housing. The present invention also relates to a method for manufacturing an electronic device including a member for a ventilation hole and a tape including a member for a ventilation hole, the tape for feeding the member.

BACKGROUND ART

It is common to provide a ventilation hole on a housing of, for example, an electronic device to ensure ventilation between the inside and the outside of the housing or to reduce a pressure change in the housing. It is also common to place a member on a housing provided with a ventilation hole to cover the ventilation hole, the member that allows passage of gas between the outside and the inside of the housing through the ventilation hole and that prevents dust or a liquid such as water from entering the inside of the housing from the outside thereof through the ventilation hole. The member for a ventilation hole typically includes a porous membrane having air permeability in its thickness direction. The member for a ventilation hole can be provided, for example, in the form of a tape for feeding a member, the tape including a substrate tape and pieces of the member placed on a surface of the substrate tape. Patent Literature 1 discloses a member for a ventilation hole, the member to be placed on a housing of a microelectromechanical systems (hereinafter referred to as "MEMS") device to cover a ventilation hole provided on the housing. Patent Literature 1 also discloses an assembly for feeding the member to a die ejector, the assembly including a liner tape on which pieces of the member are placed.

CITATION LIST

Patent Literature

Patent Literature 1: JP 2018-501972 A

SUMMARY OF INVENTION

Technical Problem

An efficient method for placing a member for a ventilation hole on a housing is that the member is fed using a tape for feeding a member, separated from a substrate tape, and suction-held by a suction-holding portion of a suction-holding device to transfer to a given position. This method can reduce damage to a porous membrane included in the member and is more reliably applicable to a downsized member, compared to a method in which a gripper head or the like is used to grasp and transfer a member. However, these days, further downsizing of members for a ventilation hole, typically members to be placed on housings of MEMS devices, is being pursued. Studies by the present inventors have revealed that pursuing further downsizing of conventional members including the member of Patent Literature 1 tends to cause defective suction-holding, which is unsatisfactory suction-holding by a suction-holding device, and that just increasing, for example, suction force of a suction-holding portion in an attempt to avoid such defective suction-holding tends to cause damage to a porous membrane. Moreover, although achievement of separation from a substrate tape by suction-holding by a suction-holding device will further improve the efficiency of the above method, it is difficult to achieve reliable separation under such a condition that defective suction-holding occurs.

In view of the above circumstances, the present invention aims to provide a member for a ventilation hole, the member being unlikely to cause defective suction-holding during suction-holding by a suction-holding device even when the member is downsized, the member being capable of reducing damage to a porous membrane during suction-holding.

Solution to Problem

The present invention provides a member for a ventilation hole, the member to be placed to cover a ventilation hole in order to allow passage of gas between an outside and an inside of a housing through the ventilation hole of the housing and prevent dust and/or a liquid from entering the inside from the outside through the ventilation hole, the member including:
 a porous membrane having air permeability in a thickness direction; and
 a provisional protective film joined to the porous membrane to cover the porous membrane from the outside side, wherein
 the provisional protective film is air-impermeable in a thickness direction or has lower air permeability in the thickness direction than the air permeability of the porous membrane, and
 the provisional protective film and the porous membrane are joined to each other in such a manner that the provisional protective film is removable from the porous membrane.

In another aspect, the present invention provides a method for manufacturing an electronic device, the electronic device including: a housing including a ventilation hole; and a member for the ventilation hole, the member being placed to cover the ventilation hole in order to allow passage of gas between an outside and an inside of the housing through the ventilation hole of the housing and prevent dust and/or a liquid from entering the inside from the outside through the ventilation hole, the member including a porous membrane having air permeability in a thickness direction and a provisional protective film joined to the porous membrane to cover the porous membrane, the provisional protective film being air impermeable in a thickness direction or having lower air permeability in the thickness direction than the air permeability of the porous membrane, the method including:
 transferring the member by a suction-holding device with a suction-holding portion of the suction-holding device in contact with the provisional protective film to a position where the member covers the ventilation hole of the housing; and
 removing the provisional protective film from the porous membrane after the transferring.

In still another aspect, the present invention provides a tape for feeding a member for a ventilation hole, the tape including:
 a substrate tape; and
 a plurality of pieces of a member for a ventilation hole, the pieces being placed on a surface of the substrate tape, wherein
 the member is to be placed to cover the ventilation hole in order to allow passage of gas between an outside and an inside of a housing through a ventilation hole of the housing and prevent dust and/or a liquid from entering the inside from the outside through the ventilation hole, the member includes a porous membrane having air permeability in a thickness direction and a provisional protective film joined to the porous membrane to cover the porous membrane on a side opposite to the substrate tape, the provisional protective film is air-impermeable in a thickness direction or has lower air permeability in the thickness direction than the air permeability of the porous membrane, and the provisional protective film and the porous membrane are joined to each other in such a manner that the provisional protective film is removable from the porous membrane.

Advantageous Effects of Invention

The member according to the present invention for a ventilation hole includes the provisional protective film joined to the porous membrane in a removable manner and can be suction-held and transferred with a suction-holding portion of a suction-holding device in contact with the provisional protective film. The provisional protective film is air-impermeable in the thickness direction or has lower air permeability in the thickness direction than the air permeability of the porous membrane in the thickness direction. Therefore, the member according to the present invention for a ventilation hole is unlikely to cause defective suction-holding during suction-holding by a suction-holding device even when downsized. Moreover, damage to the porous membrane during suction-holding is reduced because it is unnecessary to excessively increase suction force of a suction-holding portion for suction and the provisional protective film, instead of the porous membrane, can be a portion with which the suction-holding portion is in contact during suction-holding.

DESCRIPTION OF EMBODIMENTS

Embodiments of the present invention will be described with reference to the drawings hereinafter. The present invention is not limited to the following embodiments.

[Member for a Ventilation Hole]

Figure 1:
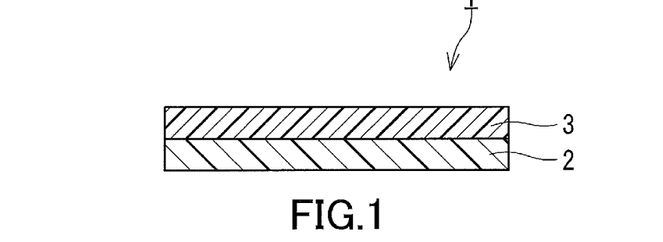
FIG. 1 is a cross-sectional view schematically showing an example of a member according to the present invention for a ventilation hole.
Figure 2A:
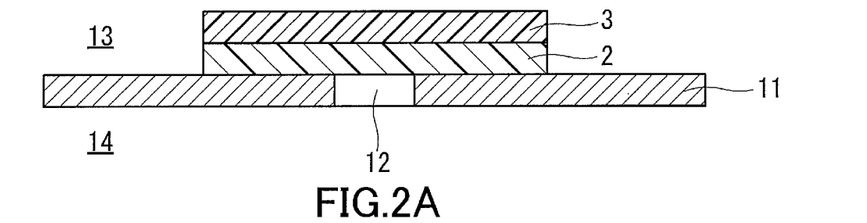
FIG. 2A is a cross-sectional view schematically showing an example of a state where the member for a ventilation hole shown in FIG. 1 is placed on a housing.
Figure 2B:
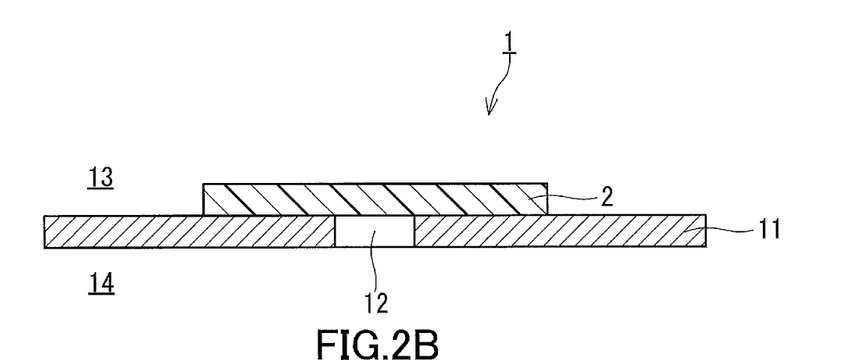
FIG. 2B is a cross-sectional view schematically showing an example of a state where the member for a ventilation hole shown in FIG. 1 is placed on a housing and a provisional protective film has been removed (use state).

FIG. 1 shows an example of a member according to the present invention for a ventilation hole. FIG. 2A shows an example of a state where the member 1 shown in FIG. 1 is placed in a housing. As shown in FIGS. 1 and 2A, the member 1 includes a porous membrane 2 having air permeability in a thickness direction and a provisional protective film 3 joined to the porous membrane 2. The provisional protective film 3 is joined to the porous membrane 2 to cover the porous membrane 2 from an outside 13 side of a housing 11. The provisional protective film 3 is air-impermeable in a thickness direction or has lower air permeability in the thickness direction than the air permeability of the porous membrane 2 in the thickness direction. The provisional protective film 3 and the porous membrane 2 are joined to each other in such a manner that the provisional protective film 3 is removable from the porous membrane 2. The member 1 is to be placed to cover a ventilation hole 12 of the housing 11. More specifically, the member 1 is to be placed on a surface on the outside 13 side of the housing 11 to cover the ventilation hole 12. When the member 1 is used, the provisional protective film 3 is removed from the porous membrane 2 (refer to FIG. 2B). In the state shown in FIG. 2B, the member 1 allows passage of gas between the outside 13 and an inside 14 of the housing 11 through the ventilation hole 12 of the housing 11 and prevents dust and/or a liquid such as water from entering the inside 14 from the outside 13 through the ventilation hole 12. In this state, the porous membrane 2 is placed to cover the ventilation hole 12 of the housing 11. More specifically, the porous membrane 2 is placed on the surface on the outside 13 side of the housing 11 to cover the ventilation hole 12.

Figure 3A:
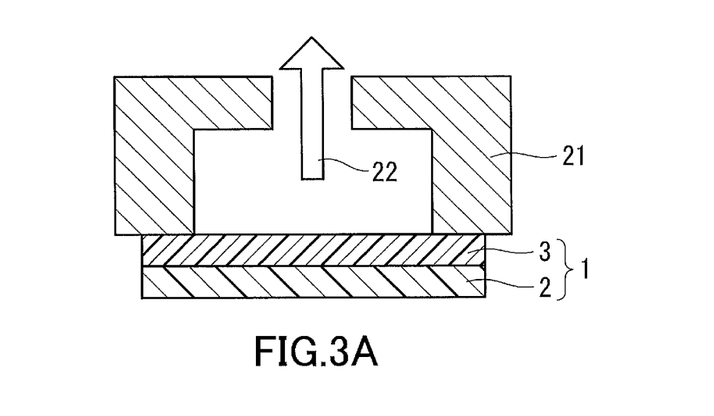
FIG. 3A is a cross-sectional view schematically showing an example of a state where the member for a ventilation hole shown in FIG. 1 is suction-held by a suction-holding device.
Figure 3B:
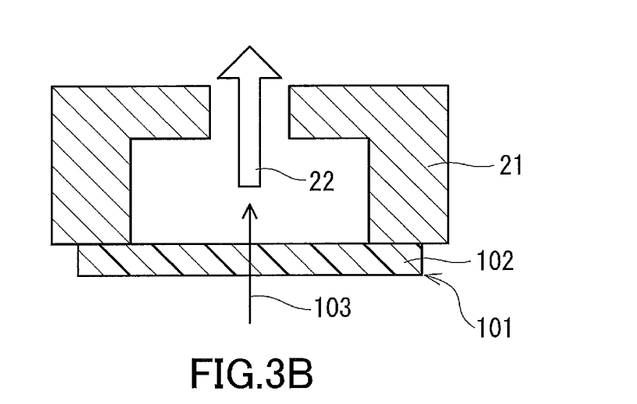
FIG. 3B is a cross-sectional view schematically showing a state where a conventional member for a ventilation hole is suction-held by a suction-holding device.

FIG. 3A shows an example of a state where the member 1 is suction-held by a suction-holding device, and FIG. 3B shows a state where a conventional member for a ventilation hole is suction-held by a suction-holding device. As shown in FIG. 3B, a conventional member 101 is suction-held by the suction-holding device such that a porous membrane 102 is in contact with a suction-holding portion 21, such as a suction head, of the suction-holding device. Defective suction-holding tends to occur because ventilation 103 through the porous membrane 102 cancels out suction force 22 of the suction-holding device. On the other hand, as shown in FIG. 3A, the member 1 can be suction-held by the suction-holding device such that the provisional protective film 3 is in contact with the suction-holding portion 21, and this allows the suction force 22 of the suction-holding device to be more reliably retained during suction-holding. Moreover, since the suction force 22 is allowed to be more reliably retained, a benefit, for example, more reliable separation of the member 1 from a substrate tape by suction-holding, can be achieved when the member 1 is fed using a tape for feeding a member.

The provisional protective film 3 is, for example, formed of a material that deforms or deteriorates by an external stimulus or by providing a solvent. The provisional protective film 3 of this type can be removed or be automatically detached (spontaneously separated) more reliably from the porous membrane 2 as a result of a decrease or loss of joining strength to the porous membrane 2 attributable to deformation or deterioration. The external stimulus is, for example, heat and/or light. The solvent is, for example, a solvent dissolving, swelling, or decomposing the material of the provisional protective film 3. The light is, for example, an infrared ray or an ultraviolet ray. Depending on the wavelength of the light, irradiation of the light can also apply heat. The term "deformation" refers to, for example, shrinkage-induced deformation. The term "deterioration" refers to, for example, disappearance of at least a portion of the provisional protective film 3 by dissolution, melting, sublimation, decomposition, or the like. However, the types of the external stimulus, the solvent, and the light and the manners of the deformation and the deterioration are not limited to the above examples. More specific examples of the provisional protective film 3 of the above type include a heat-shrinkable one formed of a material that shrinks by heat, a hot-melt one formed of a material that melts by heat, a thermally sublimatable one formed of a material that sublimates by heat, a thermally decomposable one formed of a material that is decomposed by heat, a UV-decomposable one formed of a material that is decomposed by an ultraviolet ray, and a solvent-soluble one formed of a material that dissolves in a solvent. In the case of placing the member 1 on a precision device such as a MEMS device, the heat-shrinkable provisional protective film 3 is preferred because, in that case, contamination of the device by a fragment, a decomposition product, etc., resulting from the deformation or the deterioration, of the provisional protective film 3 can be prevented. Examples of the material that deforms or deteriorates include a metal, a resin, and a composite material thereof, and the material that deforms or deteriorates can be selected according to a specific manner of the deformation or the deterioration. However, the material is not limited to the above examples. The provisional protective film 3 of the above type is, for example, joined to the porous membrane 2 with an adhesive or by welding. The adhesive is not limited, and may be a later-described adhesive whose adhesive strength decreases by an external stimulus. Examples of the welding include heat welding and ultrasonic welding.

The provisional protective film 3 may be joined to the porous membrane 2 with an adhesive whose adhesive strength decreases by an external stimulus. The provisional protective film 3 of this type can be removed or automatically detached (spontaneously separated) more reliably from the porous membrane 2 as a result of a decrease in the adhesive strength of the adhesive by an external stimulus and thereby causing a decrease or loss of joining strength to the porous membrane 2. Also in the case of placing the member 1 on a precision device such as a MEMS device, the provisional protective film 3 of this type can prevent the device from being contaminated by a fragment or a decomposition product of the provisional protective film 3. The external stimulus is, for example, heat and/or light. The light is, for example, an infrared ray or an ultraviolet ray. Depending on the wavelength of the light, irradiation of the light can also apply heat. However, the types of the external stimulus and the light are not limited to the above examples. The adhesive whose adhesive strength decreases by the external stimulus is, for example, a heat foaming adhesive whose adhesive strength decreases by heat-induced foaming or a UV-responsive adhesive whose adhesive strength decreases by irradiation with an ultraviolet ray. The decrease of the adhesive strength of the UV-responsive adhesive proceeds, for example, by UV-induced crosslinking reaction of the adhesive composition. However, the adhesive is not limited to the above examples. The provisional protective film 3 of this type may be an adhesive tape (external stimulus-responsive adhesive tape) in which an adhesive layer formed of the above adhesive is provided on a surface of a substrate. In the provisional protective film 3 of this type, examples of the material of a portion excluding the adhesive, e.g. examples of the material of the substrate of the above adhesive tape, include a metal, a resin, and a composite material thereof. Examples of the metal include aluminum and stainless steel. Examples of the resin include a polyolefin such as polyethylene or polypropylene, a polyester such as polyethylene terephthalate (PET), a fluorine resin such as polytetrafluoroethylene (PTFE), polystyrene, a polycarbonate, a polyamide, a polyimide, a polyamide-imide, and a polyetheretherketone. However, the material is not limited to the above examples.

The adhesive whose adhesive strength decreases by heat is preferably an adhesive whose adhesive strength decreases by heating to, for example, 80 to 260° C. and preferably 120 to 200° C. This adhesive is suitable for placement of the member 1 on a precision device such as a MEMS device.

The provisional protective film 3 is preferably air-impermeable in the thickness direction because, in that case, occurrence of defective suction-holding can be more reliably reduced during suction-holding. The phrase "film being air-impermeable in the thickness direction" as used herein refers to a film having an air permeance (Gurley air permeability) of more than 100,000 sec/100 mL in the thickness direction, the air permeance being measured according to Method B (Gurley method) for air permeability measurement as defined in Japanese Industrial Standards (hereinafter referred to as "JIS") L 1096: 2010. The air permeability of the porous membrane 2 in the thickness direction and that of the provisional protective film 3 in the thickness direction are compared in terms of their Gurley air permeabilities. The permeability of the provisional protective film 3 having air permeability in the thickness direction is, for example, 100 to 100,000 sec/100 mL and may be 1,000 to 100,000 sec/100 mL, as expressed in terms of the Gurley air permeability.

The Gurley air permeability can be evaluated using a measurement jig even when the size of the film to be evaluated does not satisfy the size (about 50 mm×50 mm) of a specimen defined for the Gurley method. An example of the measurement jig is a polycarbonate disc having a thickness of 2 mm and a diameter of 47 mm and provided with a through hole (having a circular cross-section having a diameter of 1 mm or 2 mm) at the center thereof. The Gurley air permeability can be measured in the following manner using this measurement jig.

A film to be evaluated is fixed to one surface of the measurement jig to cover an opening of the through hole of the measurement jig. The film to be evaluated is fixed so that during measurement of the Gurley air permeability, air passes only through the opening and an effective testing portion (a portion overlapping the opening when viewed in the direction perpendicular to a principal surface of the fixed film) of the film to be evaluated and a fixed portion will not hinder passage of the air through the effective testing portion of the film. To fix the film, a double-faced adhesive tape on which a vent having a shape corresponding to the shape of the opening is punched in a central part can be used. The double-faced adhesive tape is required to be placed between the measurement jig and the film such that the circumference of the vent and that of the opening are aligned. Next, the measurement jig to which the film is fixed is set in a Gurley air permeability test apparatus such that the surface on which the film is fixed is on the downstream side of an air flow at the time of measurement. The time t1 required for 100 mL of air to pass through the film is measured. Then, the measured time t1 is converted by the following formula to a value t per effective testing area 642 [mm$^2$] defined in Method B (Gurley method) for air permeability measurement in JIS L 1096: 2010: t={(t1)×(area [mm$^2$] of effective testing portion of film)/642 [mm$^2$]}. The resulting value t can be employed as the Gurley air permeability of the film. When the above disc is used as a measurement jig, the area of the effective testing portion of the film is the area of a cross-section of the through hole. Additionally, it has been confirmed that the Gurley air permeability measured for a film satisfying the above specimen size without using the measurement jig and the Gurley air permeability measured for a small piece of the film using the measurement jig correspond well to each other, which means the use of the measurement jig substantially has no effect on a measured Gurley air permeability value.

The provisional protective film 3 may have air permeability in the in-plane direction. The provisional protective film 3 is preferably air-impermeable in the in-plane direction because, in that case, cancellation of the suction force 22 generated by the suction-holding portion 21 of a suction-holding device by the air permeability of the provisional protective film 3 in the in-plane direction (occurrence of what is called "side leakage") can be prevented. The provisional protective film 3 being air-impermeable in the thickness direction and/or the in-plane direction is, for example, a film with no communication hole, such as a through hole, connecting surfaces of the film 3 in the thickness direction and/or the in-plane direction, or may be a film with no pore.

The thickness of the provisional protective film 3 (in the case where the provisional protective film 3 is an adhesive tape having an adhesive layer, the thickness of the adhesive layer is excluded) is, for example, 1 to 500 μm and may be 10 to 200 μm or even 25 to 100 μm. When the thickness of the provisional protective film 3 is in these ranges, occurrence of defective suction-holding and damage to the porous membrane 2 during suction-holding can be more reliably reduced.

The adhesive strength of the provisional protective film 3 to the porous membrane 2 is required to be, for example, so strong that the provisional protective film 3 is not separated from the porous membrane 2 while the provisional protective film 3 suction-held by the suction-holding portion 21 is being transferred by a suction-holding device. In the case where the provisional protective film 3 is joined to the porous membrane 2 with the adhesive whose adhesive strength decreases by the external stimulus, the adhesive strength (initial adhesive strength) to the porous membrane 2 before application of an external stimulus is, for example, 0.1 N/25 mm or more and may be 0.13 N/25 mm or more, 0.2 N/25 mm or more, 0.3 N/25 mm or more, 0.4 N/25 mm or more, or even 0.45 N/25 mm or more, as expressed in terms of 180° peel adhesion strength measured according to Testing Method 1 for adhesive strength, as defined in JIS Z 0237: 2009. The upper limit of the initial adhesive strength is, for example, 5 N/25 mm or less as expressed in terms of the 180° peel adhesion strength. On the other hand, an adhesive strength (post-response adhesive strength) to the porous membrane 2 of the provisional protective film 3 whose adhesive strength has decreased by an external stimulus is, for example, 0.7 N/25 mm or less, and may be 0.5 N/25 mm or less, less than 0.45 N/25 mm, 0.4 N/25 mm or less, 0.3 N/25 mm or less, or even 0.2 N/25 mm or less. The post-response adhesive strength thereof may be 0 N/25 mm, and, in this case, the provisional protective film 3 can be automatically detached (spontaneously separated) from the porous membrane 2. In evaluation of the adhesive strength of the provisional protective film 3 to the porous membrane 2, a specimen has a width of 25 mm, the separation speed is 300 mm/min, a testing plate is a SUS304 plate having a surface to which a porous PTFE membrane (TEMISH (registered trademark) NTF1131 manufactured by NITTO DENKO CORPORATION) is attached, and a press-bonding surface of the testing plate to which the specimen is press-bonded is an exposed surface of the porous PTFE membrane.

Figure 4A:
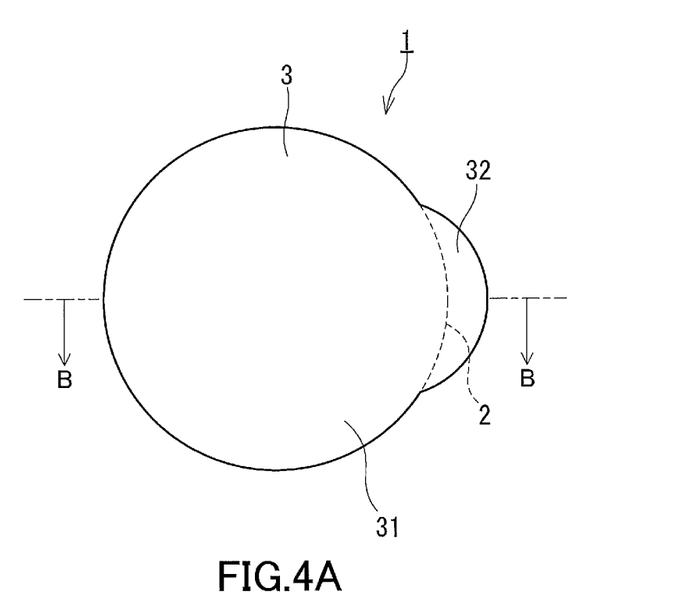
FIG. 4A is a plan view schematically showing another example of the member according to the present invention for a ventilation hole.
Figure 4B:
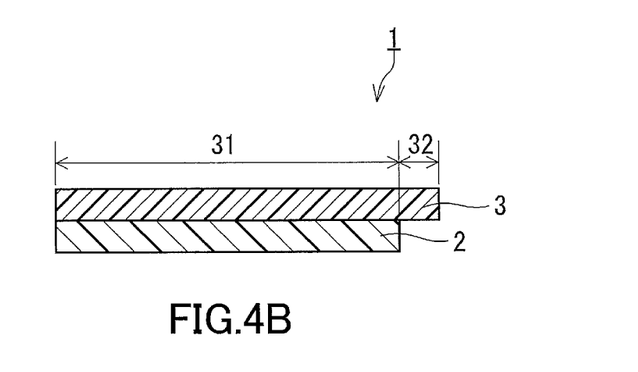
FIG. 4B is a cross-sectional view schematically showing a cross-section B-B of the member for a ventilation hole shown in FIG. 4A.

The provisional protective film 3 typically has the shape of a polygon, such as a square or a rectangle, a circle, or an oval when viewed in the direction perpendicular to its principal surface. The shape of the provisional protective film 3 may be the same as that of the porous membrane 2. The provisional protective film 3 may include a joined portion 31 joined to the porous membrane 2 and a tab portion 32 protruding outward from a peripheral edge of the joined portion 31. The members 1 shown in FIGS. 4A and 4B include the provisional protective film 3 including the tab portion 32. FIG. 4B shows a cross-section B-B of the member 1 shown in FIG. 4A. However, the shape of the provisional protective film 3 is not limited to these examples.

Figure 5:
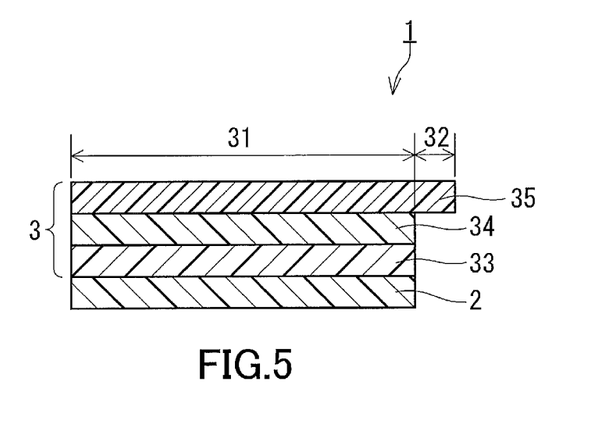
FIG. 5 is a cross-sectional view schematically showing yet another example of the member according to the present invention for a ventilation hole.

The provisional protective film 3 is not limited to the above examples as long as the provisional protective film 3 can be joined to the porous membrane 2 in such a manner that the provisional protective film 3 is removable from the porous membrane 2. The manner in which the provisional protective film 3 is joined to the porous membrane 2 is not limited to the above examples as long as the provisional protective film 3 is joined in such a manner that the provisional protective film 3 is removable from the porous membrane 2. FIG. 5 shows an example of the member 1 including the provisional protective film 3 of a type different from the above examples. The provisional protective film 3 included in the member 1 shown in FIG. 5 has a multilayer structure including an external stimulus-responsive tape 33, a tab sheet 35 including the tab portion 32, and an adhesive layer 34 joining the external stimulus-responsive tape 33 and the tab sheet 35. The surface of the provisional protective film 3 on the external stimulus-responsive tape 33 side is joined to the porous membrane 2. The provisional protective film 3 can be more reliably removed by decreasing the adhesive strength of the external stimulus-responsive tape 33 to the porous membrane 2 by an external stimulus. However, as long as the provisional protective film 3 can be removed by pulling up the tab portion 32, the external stimulus-responsive tape 33 may be omitted and the adhesive layer 34 and the provisional protective film 3 may be directly joined to the porous membrane 2.

The porous membrane 2 is commonly formed of a material that deforms or deteriorates less than the provisional protective film 3 by an external stimulus or by providing a solvent. The porous membrane 2 is preferably formed of a material that does not deform nor deteriorate by applying an external stimulus or providing a solvent for removal of the provisional protective film 3 from the porous membrane 2. Examples of the material forming the porous membrane 2 include a metal, a resin, and a composite material thereof. Examples of the metal include aluminum and stainless steel. Examples of the resin include a polyolefin such as polyethylene or polypropylene, a polyester such as PET, a fluorine resin such as PTFE, polystyrene, a polycarbonate, a polyamide, a polyimide, a polyamide-imide and a polyetheretherketone.

Examples of the form of the porous membrane 2 include a non-woven fabric, a woven fabric, a mesh, a net, or a porous membrane. However, the form of the porous membrane 2 is not limited to the above examples as long as the porous membrane 2 has air permeability in the thickness direction.

The porous membrane 2 may include a porous membrane (porous PTFE membrane) formed by stretching a paste extrusion body containing PTFE particles or a cast film containing PTFE particles or may be a porous PTFE membrane. The porous PTFE membrane is formed of fine PTFE fibrils and can have a node in which PTFE is more highly aggregated than in the fibrils. The porous PTFE membrane has a good balance between mass and strength. Moreover, the porous PTFE membrane can have a high water entry pressure depending on its configuration and can have a higher water entry pressure, for example, by liquid-repellent treatment.

The average pore diameter of the porous membrane 2 that is the porous PTFE membrane is, for example, 0.01 to 10 µm. The porosity of the porous membrane 2 that is the porous PTFE membrane is, for example, 50 to 90%. The average pore diameter of the porous PTFE membrane can be measured according to American Society for Testing and Materials (ASTM) F316-86. The porosity of the porous PTFE membrane can be calculated by substituting the mass, thickness, area (area of a principal surface), and true density of the membrane in the following formula. The true density of PTFE is 2.18 g/cm$^3$.

Porosity (%)={1−(mass [g]/(thickness [cm]×area [cm$^2$]×true density [2.18 g/cm$^3$]))}×100

The porous membrane 2 may be a through hole sheet. The through hole sheet is a sheet made by providing a raw sheet, such as an imperforate sheet, having a non-porous matrix structure with a plurality of through holes (penetrating holes) to penetrate the raw sheet in the thickness direction. The through hole sheet may be a sheet having no other ventilation paths in the thickness direction than the plurality of through holes. The through hole may be a straight hole linearly extending in the thickness direction of the sheet. Apertures of a net or a mesh are each commonly in the shape of a polygon such as a quadrangle. In contrast, the opening of the through hole is commonly in the shape of a circle or an oval when viewed in the direction perpendicular to a principal surface of the through hole sheet. The shape of a cross-section of the through hole may stay constant from one principal surface of the sheet to the other principal surface thereof, or may change between one principal surface of the sheet and the other principal surface thereof. When viewed in the direction perpendicular to the principal surface of the sheet, the through holes may be formed such that their openings are regularly arranged on the principal surface or may be formed such that their openings are randomly positioned on the principal surface. The through hole sheet may be a metal sheet or a resin sheet. The through holes can be formed, for example, by laser processing of the raw sheet or by ion beam irradiation of the raw sheet and subsequent perforation of the resulting sheet by chemical etching. Laser processing achieves more reliable formation of through holes whose openings are regularly arranged on a principal surface of the sheet when viewed in the direction perpendicular to the principal surface. For example, the sheet disclosed in JP 2012-020279 A can be used as the through hole sheet. Liquid-repellent treatment of the sheet may or may not be performed.

The porous membrane 2 may have an area of 100 mm$^2$ or less, 25 mm$^2$ or less, 9 mm$^2$ or less, or even 1 mm$^2$ or less. For example, with the use of the porous membrane 2 having an area of 9 mm$^2$ or less, the member 1 further downsized for placement on a precision device such as a MEMS device can be created. Meanwhile, the member 1 can reduce occurrence of defective suction-holding and damage to the porous membrane 2 during suction-holding even when downsized. In other words, the effect of the present invention is more significant when the area of the porous membrane 2 is 9 mm$^2$ or less. However, the area of the porous membrane 2 is not limited to the above range, and may be, for example, in a greater range, specifically 400 mm$^2$ or less, depending on the type of the housing 11 on which the member 1 is placed and the area of the ventilation hole 12. The lower limit of the area of the porous membrane 2 is, for example, 0.25 mm$^2$ or more.

The housing 11 on which the member 1 is placed may be the housing 11 of an intermediate product to be made into a precision device such as a MEMS device by microfabrication such as dicing. In other words, the member 1 may be placed on the housing 11 of an intermediate product to be made into a precision device such as a MEMS device by microfabrication such as dicing. In this case, the member 1 is typically cut together with the housing 11 of the intermediate product by microfabrication and is then placed on the housing 11 of a precision device made by the microfabrication to cover the ventilation hole 12. In the case of placement on an intermediate product, the provisional protective film 3 can reduce damage to the porous membrane 2 at the time of microfabrication such as dicing. The area of the porous membrane 2 of the member 1 to be placed on an intermediate product is, for example, 0.25 to 100 mm$^2$ and may be 1 to 25 mm$^2$.

The thickness of the porous membrane 2 is, for example, 1 to 500 µm and may be 5 to 200 µm or even 10 to 100 µm.

The air permeability of the porous membrane 2 in the thickness direction is, for example, 0.05 sec/100 mL to 1,000 sec/100 mL and may be 0.1 sec/100 mL to 200 sec/100 mL or even 0.5 sec/100 mL to 100 sec/100 mL, as expressed in terms of the Gurley air permeability.

The surface density of the porous membrane 2 is, for example, 1 to 50 g/m$^2$. The surface density of the porous membrane 2 may be 1 to 30 g/m$^2$ or even 1 to 25 g/m$^2$. The surface density thereof can be calculated by dividing the mass of the porous membrane 2 by the area (the area of a principal surface) thereof.

The porous membrane 2 typically has the shape of a polygon, such as a square or a rectangle, a circle, or an oval when viewed in the direction perpendicular to its principal surface. However, the shape of the porous membrane 2 is not limited to these examples.

The porous membrane 2 may be a waterproof membrane preventing water from entering the inside 14 of the housing 11 from the outside 13 thereof through the ventilation hole 12 thereof. The water proofness of the porous membrane 2 can be evaluated based on its water entry pressure. The water entry pressure of the porous membrane 2 is, for example, 1 kPa or more. The water entry pressure of the porous membrane 2 may be 10 kPa or more, 15 kPa or more, or even 20 kPa or more. The upper limit of the water entry pressure thereof is, for example, 2,000 kPa or less. The water entry pressure of the porous membrane 2 can be measured in the following manner according to Method A (low water pressure method) or Method B (high water pressure method) of the water resistance test in JIS L 1092: 2009 using a measurement jig.

An example of the measurement jig is a stainless steel disc having a diameter of 47 mm and provided with a through hole (having a circular cross-section) having a diameter of 1 mm at the center thereof. This disc has such a thickness that the disc is not deformed by a water pressure applied to measure the water entry pressure. The water entry pressure can be measured in the following manner using this measurement jig.

The porous membrane 2 to be evaluated is fixed to one surface of the measurement jig to cover an opening of the through hole of the measurement jig. The porous membrane 2 is fixed so that water will not leak from a fixed portion of the membrane during the measurement of the water entry pressure. To fix the porous membrane 2, a double-faced adhesive tape on which a water port having a shape corresponding to the shape of the opening is punched in a central part can be used. The double-faced adhesive tape is required to be placed between the measurement jig and the porous membrane 2 such that the circumference of the water port and that of the opening are aligned. Next, the measurement jig to which the porous membrane 2 is fixed is set in a test apparatus such that the surface opposite to the surface on which the porous membrane 2 is fixed is a surface to which a water pressure is applied at the time of the measurement. Then, the water entry pressure is measured according to Method A (low water pressure method) or Method B (high water pressure method) of water resistance test in JIS L 1092: 2009. It should be noted that the water entry pressure measured is a water pressure that causes water to come out from one region of the surface of the porous membrane 2. The measured water entry pressure can be employed as the water entry pressure of the porous membrane 2. As the test apparatus can be used an apparatus having a specimen installation structure that allows the measurement jig to be set therein, the apparatus having the same configuration as the water resistance test apparatus exemplified in JIS L 1092: 2009.

The porous membrane 2 may have been subjected to water-repellent treatment, oil-repellent treatment, or liquid-repellent treatment. The treatments can improve the water proofness of the porous membrane 2. The porous membrane 2 may have been subjected to various treatments such as coloring treatment. Water-repellent treatment, oil-repellent treatment, liquid-repellent treatment, and coloring treatment of the porous membrane 2 can be performed by a known method.

Figure 6A:
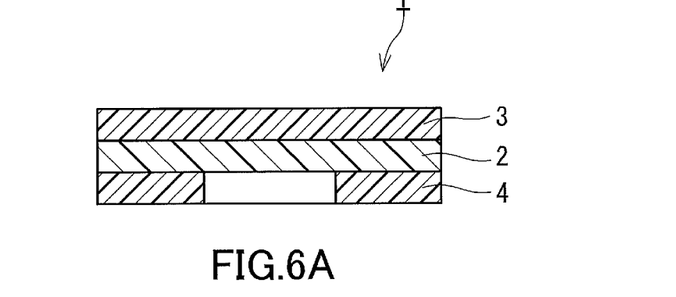
FIG. 6A is a cross-sectional view schematically showing yet another example of the member according to the present invention for a ventilation hole.
Figure 6B:
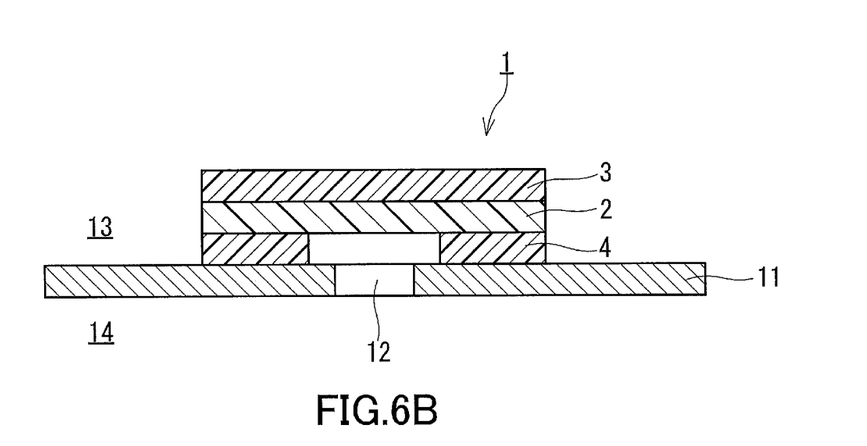
FIG. 6B is a cross-sectional view schematically showing an example of a state where the member for a ventilation hole shown in FIG. 6A is placed on a housing.

The member 1 for a ventilation hole can be fixed to the surface of the housing 11, for example, by adhesion or welding. Therefore, the member 1 may further include an adhesive layer 4 joined to the porous membrane 2 from the inside 14 side (refer to FIG. 6A). The adhesive layer 4 is located on the opposite side of the porous membrane 2 from the provisional protective film 3. The member 1 shown in FIG. 6A can be fixed to the surface of the housing 11 with the adhesive layer 4. FIG. 6B shows an example of a state where the member 1 shown in FIG. 6A is fixed to the surface of the housing 11. The member 1 is to be placed on the surface on the outside 13 of the housing 11 to cover the ventilation hole 12 of the housing 11 as shown in FIG. 6B. When the member 1 is used, the provisional protective film 3 is removed from the porous membrane 2 (refer to FIG. 6C). In the state shown in FIG. 6C, the member 1 allows passage of gas between the outside 13 and the inside 14 of the housing 11 through the ventilation hole 12 of the housing 11 and prevents dust and/or a liquid such as water from entering the inside 14 from the outside 13 through the ventilation hole 12.

Figure 6C:
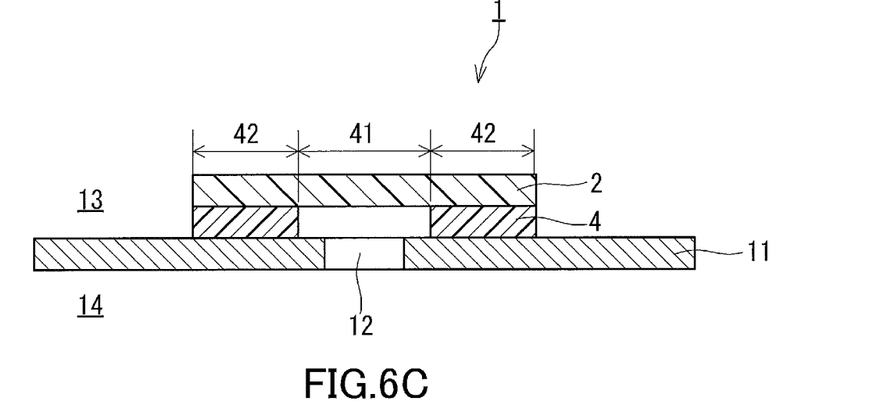
FIG. 6C is a cross-sectional view schematically showing an example of a state where the member for a ventilation hole shown in FIG. 6A is placed on a housing and a provisional protective film has been removed (use state).

The adhesive layer 4 of the member 1 shown in FIGS. 6A to 6C has the same shape as that of a peripheral portion of the porous membrane 2 when viewed in the direction perpendicular to a principal surface of the porous membrane 2. More specifically, the adhesive layer 4 has the shape of a ring, which is the shape of the peripheral portion of the porous membrane 2 that is circular, when viewed from the above direction. When the adhesive layer 4 has the shape of the peripheral portion of the porous membrane 2, the member 1 is air-permeable in the thickness direction mainly through a non-placement region 41 where the adhesive layer 4 is not placed, the non-placement region 41 being surrounded by the peripheral portion of the porous membrane 2 in a state where the member 1 is placed on the housing 11 and the provisional protective film 3 has been removed (the state shown in FIG. 6C).

When the adhesive layer 4 has the shape of the peripheral portion of the porous membrane 2, the ratio of the area of a placement region 42 where the adhesive layer 4 is placed to the total area of the porous membrane 2 is, for example, 15 to 99%, and may be 20 to 99% or even 30 to 99%.

The adhesive layer 4 can be formed, for example, by applying a known adhesive to the surface on the inside 14 side of the porous membrane 2. The adhesive layer 4 may be a double-faced adhesive tape. The double-faced adhesive tape may be a tape including a substrate whose surfaces are each provided with an adhesive layer, or may be a substrate-less tape having no substrate sheet and composed only of an adhesive layer. In the member 1, a substrate-less double-faced adhesive tape can be adopted as the adhesive layer 4 because the provisional protective film 3 can improve the stiffness exhibited by the member 1 during suction-holding.

Various adhesives such as an acrylic adhesive, a silicone adhesive, an epoxy adhesive, a urethane adhesive, and a rubber adhesive can be used as the adhesive (including an adhesive included in the adhesive layer 4 that is a double-faced adhesive tape) included in the adhesive layer 4. However, in the case where the provisional protective film 3 is joined to the porous membrane 2 with the adhesive whose adhesive strength decreases by the external stimulus, the adhesive included in the adhesive layer 4 is preferably an adhesive whose adhesive strength decreases less than the adhesive strength of the above external stimulus-responsive adhesive when the same external stimulus is applied to the adhesives and is more preferably an adhesive whose adhesive strength does not decrease by the same external stimulus as that for decreasing the adhesive strength of the above external stimulus-responsive adhesive.

The substrate of the double-faced adhesive tape is, for example, a resin film, a non-woven resin fabric, or a resin foam. The resin that can be used as the substrate is not limited, and is a polyester such as PET, a polyolefin such as polyethylene or polypropylene, a polyimide, a polyetheretherketone, a polyamide, a polyamide-imide, or a fluorine resin such as PTFE. The adhesive layer 4 may be a double-faced adhesive tape including a substrate formed of a heat-resistant resin including at least one selected from a polyimide, a polyester, a polyetheretherketone, a polyamide-imide, and a fluorine resin. In this case, the member 1 placed on a housing of a precision device such as a MEMS device can be subjected to a high-temperature process such as reflow soldering.

The configuration of the adhesive layer 4 is not limited to the above examples as long as the member 1 in the state shown in FIG. 6C has air permeability in the thickness direction and allows passage of gas between the outside 13 and the inside 14 of the housing 11 through the ventilation hole 12 and the member 1 can be stably kept placed on the housing 11 at the time of removal of the provisional protective film 3 from the porous membrane 2.

The member 1 for a ventilation hole may further include a member and/or a layer other than those described above as long as the effect of the present invention can be obtained.

The housing 11 on which the member 1 for a ventilation hole is to be placed is, for example, a housing of a MEMS device. Although MEMS devices are so tiny that small ones have a size of 1 mm square, they are becoming more and more important these days as devices to be mounted in various products to sophisticate the products and offer high added value to the products. Some MEMS devices are non-encapsulated products having ventilation holes on surfaces of their packages, on which the member 1 can be placed to cover the ventilation holes. Examples of non-encapsulated MEMS devices include various sensors detecting the atmospheric pressure, humidity, gas, air flow, and the like and electroacoustic transducer elements such as speakers and microphones. However, the housing 11 on which the member 1 for a ventilation hole is to be placed is not limited to the above examples.

The member 1 for a ventilation hole may be a member (sound-permeable member) allowing passage of sound between the outside and the inside of the housing 11 through the ventilation hole 12 of the housing 11. The member 1 that is a sound-permeable member is to be placed, for example, on a housing of an electroacoustic transducer element, such as a speaker or a microphone, and/or a housing of an electronic device including such an element.

The member 1 for a ventilation hole can be produced, for example, by joining the provisional protective film 3 to one surface of the porous membrane 2. The member 1 further including the adhesive layer 4 can be produced, for example, by joining the provisional protective film 3 to one surface of the porous membrane 2 and forming the adhesive layer 4 on the other surface thereof.

[Tape for Feeding Member]

Figure 7:
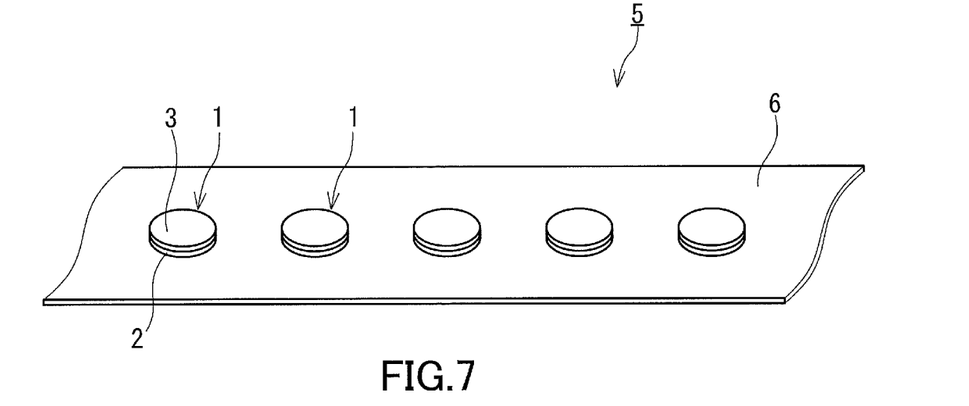
FIG. 7 is a perspective view schematically showing an example of a tape according to the present invention for feeding a member.

FIG. 7 shows an example of a tape according to the present invention for feeding a member. A tape 5, shown in FIG. 7, for feeding a member includes a substrate tape 6 and a plurality of pieces of the member 1 for a ventilation hole, the pieces being placed on a surface of the substrate tape 6.

The tape 5 for feeding a member is a tape for feeding the member 1. The member 1 is to be placed to cover the ventilation hole 12 in order to allow passage of gas between the outside 13 and the inside 14 of the housing 11 through the ventilation hole 12 of the housing 11 and prevent dust and/or a liquid such as water from entering the inside 14 from the outside 13 through the ventilation hole 12. The member 1 includes the porous membrane 2 having air permeability in the thickness direction and the provisional protective film 3 joined to the porous membrane 2 to cover the porous membrane 2 on a side opposite to the substrate tape 6. The provisional protective film 3 is air-impermeable in the thickness direction or has air permeability lower than the air permeability of the porous membrane 2 in the thickness direction. The provisional protective film 3 and the porous membrane 2 are joined to each other in such a manner that the provisional protective film 3 is removable from the porous membrane 2. With the use of the tape 5 for feeding a member, the member 1 can be effectively fed, for example, to a suction-holding device. The member 1 fed to a suction-holding device using the tape 5 for feeding a member can be separated from the substrate tape 6 by suction-holding by the suction-holding device with the suction-holding portion 21 of the suction-holding device in contact with the provisional protective film 3. In this process, owing to the provisional protective film 3, damage to the porous membrane 2 can be reduced during suction-holding, defective suction-holding is unlikely to occur, and, accordingly, the member 1 can be more reliably separated from the substrate tape 6.

In the tape 5 for feeding a member, the configurations of the member 1 and the members included in the member 1 are the same as those mentioned above in the description of the member according to the present invention for a ventilation hole as long as the provisional protective film 3 is joined to the porous membrane 2 to cover the porous membrane 2 on a side opposite to the substrate tape 6.

The substrate tape 6 is, for example, formed of paper, a metal, a resin, and a composite material thereof. Examples of the metal includes aluminum and stainless steel. Examples of the resin include a polyester such as PET, and a polyolefin such as polyethylene and polypropylene. However, the material of the substrate tape 6 is not limited to these examples.

The member 1 may be placed on the substrate tape 6 with an adhesive layer (for example, the adhesive layer 4) of the member 1 interposed therebetween. In this case, a surface of the substrate tape 6, the surface where the member 1 is placed, may be subjected to release treatment for improving ease of release from the substrate tape 6. The release treatment can be performed by a known method.

The member 1 may be placed on the substrate tape 6 with an adhesive layer interposed therebetween, the adhesive layer being included in the substrate tape 6 and being located on the surface of the substrate tape 6. In this case, the member 1 may or may not include the adhesive layer 4. The adhesive layer included in the substrate tape 6 preferably has weak adhesiveness so that the member 1 can be more reliably separated. Additionally, the adhesive layer included in the substrate tape 6 may be formed of an adhesive whose adhesive strength decreases by an external stimulus. However, in the case where the provisional protective film 3 is joined to the porous membrane 2 with the adhesive whose adhesive strength decreases by the external stimulus, the adhesive included in the substrate tape 6 preferably reacts to an external stimulus different from the external stimulus to which the adhesive joining the provisional protective film 3 and the porous membrane 2 reacts.

The thickness of the substrate tape 6 is, for example, 1 to 200 μm.

The tape 5 shown in FIG. 7 for feeding a member is strip-shaped, and the pieces of the member 1 are placed in one direction (the direction along which the substrate tape 6 extends) in series on the surface of the strip-shaped substrate tape 6. However, the shape of the tape 5 for feeding a member, the shape of the substrate tape 6, and the way of placing the pieces of the member 1 on the substrate tape 6 are not limited to this example. For example, the tape 5 for feeding a member may be a sheet having any of various shapes such as a polygon, such as a rectangle or a square, a circle, or an oval, and the pieces of member 1 may be placed at intersections of a grid or in a staggered pattern on the surface of the substrate tape 6 being a sheet when viewed perpendicularly to the surface. Additionally, the strip-shaped tape 5 for feeding a member may be a wound body (reel) wound around a winding core.

The tape 5 for feeding a member can be produced by placing the pieces of member 1 on the surface of the substrate tape 6.

[Method for Manufacturing Electronic Device]

Figure 8A:
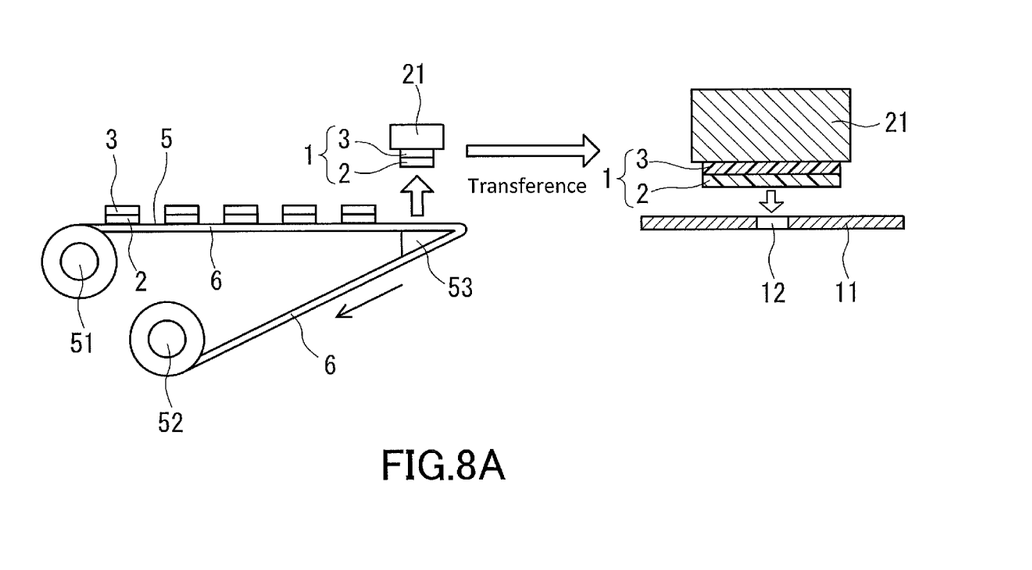
FIG. 8A is a process diagram showing an example of a method according to the present invention for manufacturing an electronic device.
Figure 8B:
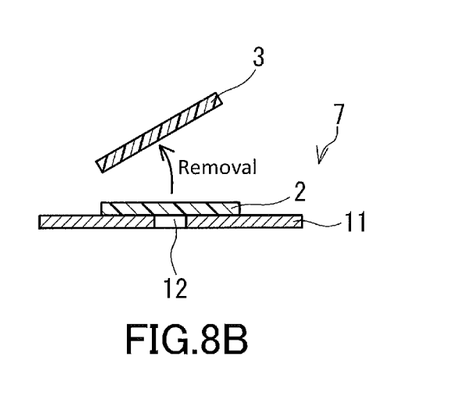
FIG. 8B is a process diagram showing an example of the method according to the present invention for manufacturing an electronic device.

An example of a method according to the present invention for manufacturing an electronic device will be described with reference to FIGS. 8A and 8B. The example shown in FIGS. 8A and 8B includes:

transferring the member 1 by a suction-holding device with the suction-holding portion 21 of the suction-holding device in contact with the provisional protective film 3 to a position where the member 1 covers the ventilation hole 12 of the housing 11, the member 1 including the porous membrane 2 having air permeability in the thickness direction and the provisional protective film 3 joined to the porous membrane 2 to cover the porous membrane 2, the provisional protective film 3 being air-impermeable in the thickness direction or having lower air permeability in the thickness direction than the air permeability of the porous membrane 2 (FIG. 8A); and removing the provisional protective film 3 from the porous membrane 2 at the position (FIG. 8B). An electronic device 7 can be manufactured by this method, the electronic device 7 including: the housing 11 including the ventilation hole 12; and the member 1 for a ventilation hole, the member 1 being placed to cover the ventilation hole 12 in order to allow passage of air between the outside 13 and the inside 14 of the housing 11 through the ventilation hole 12 of the housing 11 and prevent dust and/or a liquid from entering the inside 14 from the outside 13 through the ventilation hole 12. This manufacturing method is unlikely to cause defective suction-holding during suction-holding of the member 1 by the suction-holding device, and can reduce damage to the porous membrane 2 during suction-holding. In addition, this manufacturing method can offer, for example, the following benefits: (1) in a phase prior to the removal of the provisional protective film 3, the housing 11 can be further transferred by the suction-holding device with the member 1 fixed to the surface of the housing 11, and, at that time, transferring of the housing 11 by suction-holding is more reliably achieved by suction-holding the provisional protective film 3; and (2) owing to the provisional protective film 3, the electronic device 7 including the porous membrane 2 not exposed to foreign matters, such as dust, that can be generated during manufacture of the electronic device 7 can be obtained. It should be noted that the provisional protective film 3 can be removed from the porous membrane 2 at any timing after transferring the member 1 to a position where the member 1 covers the ventilation hole 12. For example, the provisional protective film 3 may be removed from the porous membrane 2 in a subsequent step that can follow the fixation of the member 1 to the surface of the housing 11 or at any timing after the subsequent step.

In the example shown in FIGS. 8A and 8B, the member 1 is fed to the suction-holding device using the tape 5 for feeding a member. More specifically, the tape 5 drawn from a wound body (reel) 51 of the tape 5 is conveyed onto a separation stage 53 so as to be fed to the suction-holding device including the suction-holding portion 21, and, just before turning at an edge of the separation stage 53, the member 1 is suction-held by the suction-holding portion 21 to be separated from the substrate tape 6. The member 1 suction-held by the suction-holding portion 21 and separated from the substrate tape 6 remains suction-held by the suction-holding portion 21 while being transferred to the position where the member 1 covers the ventilation hole 12 of the housing 11. Then, at the position, the member 1 is fixed to the surface of the housing 11. A method such as adhesion using an adhesive layer (for example, the adhesive layer 4 included in the member 1) or welding can be adopted for the fixation of the member 1 to the surface of the housing 11. The substrate tape 6 from which the member 1 is separated is collected by winding the substrate tape 6 around a take-up roll 52. However, in the method according to the present invention for manufacturing an electronic device, a method for transferring the member 1 to the above-described position is not limited to the above examples as long as the member 1 is transferred by the suction-holding device with the suction-holding portion 21 in contact with the provisional protective film 3.

As to the member 1 transferred to the position where the member 1 covers the ventilation hole 12, the method for removing the provisional protective film 3 from the porous membrane 2 is not limited. In the case of the provisional protective film 3 formed of the material that deforms or deteriorates by the external stimulus or by providing the solvent, the provisional protective film 3 may be removed from the porous membrane 2 by applying the external stimulus to the provisional protective film 3 or by providing the solvent. In the case where the provisional protective film 3 is joined to the porous membrane 2 with the adhesive whose adhesive strength decreases by the external stimulus, the provisional protective film 3 may be removed from the porous membrane 2 by applying the external stimulus to the adhesive to decrease the adhesive strength of the adhesive.

Figure 9:
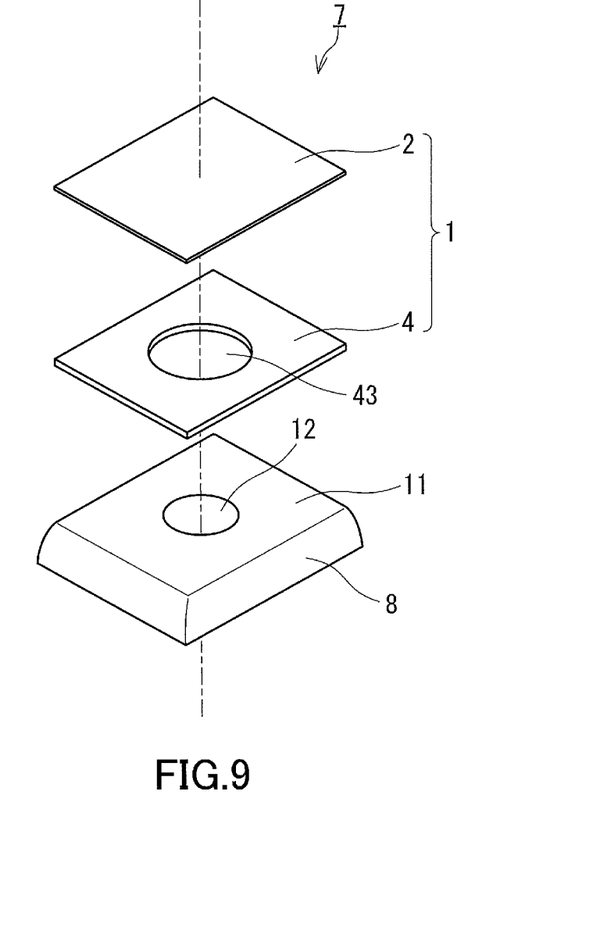
FIG. 9 is an exploded perspective view schematically showing an example of an electronic device obtained by the method according to the present invention for manufacturing an electronic device.

FIG. 9 shows an example of an electronic device obtained by the method according to the present invention for manufacturing an electronic device. The electronic device 7 shown in FIG. 9 is a non-encapsulated MEMS device including the ventilation hole 12 in the housing 11. The porous membrane 2 is placed on and fixed to the housing 11 of the electronic device 7 to cover the ventilation hole 12 with the adhesive layer 4 interposed therebetween. The adhesive layer 4 has the same shape as that of the peripheral portion of the porous membrane 2 when viewed in the direction perpendicular to the surface of the porous membrane 2. In other words, the adhesive layer 4 has a through hole 43 being air-permeable in the thickness direction at the center. In the electronic device 7, the member 1 including the porous membrane 2 can allow passage of gas between the outside 13 and the inside 14 of the housing 11 through the ventilation hole 12 and prevent dust and/or a liquid such as water from entering the inside 14 from the outside 13 through the ventilation hole 12. However, electronic devices that can be obtained by the method according to the present invention for manufacturing an electronic device are not limited to the above example. The other electronic devices may be information devices such as smartphones or tablet PCs. Examples of the non-encapsulated MEMS devices are as described above.

EXAMPLES

Hereinafter, the present invention will be described more specifically by way of examples. The present invention is not limited to the following examples.

First, methods for evaluating members for a ventilation hole which were produced in EXAMPLES will be described.

[Adhesive Strength of Provisional Protective Film to Porous Membrane]

Adhesive strengths (initial adhesive strengths and, for Examples 1 to 6 in which an external stimulus-responsive tape was used as a provisional protective film, post-response adhesive strengths obtained after application of heat or an ultraviolet ray) of provisional protective films to porous membranes were evaluated by the above method. Preparation of specimens, attachment of the specimens to testing plates, and evaluation of the adhesive strengths were performed in an atmosphere at 23° C.±5° C. For higher accuracy, the evaluation was performed when 30 minutes had passed since attachment of each specimen to a testing plate and the adhesive strength of the provisional protective film became stable.

[Suction-Holding Stability of Member Suction-Held by Suction-Holding Device (Pickup Property)]

Suction-holding stabilities of members produced in Examples 1 to 8 and Comparative Example 1 suction-held by a suction-holding device were evaluated as follows.

A feeding tape including a substrate tape and each member described above and placed on a surface of the substrate tape was produced. As the substrate tape was used a release liner (RT-50Et manufactured by NITTO DENKO CORPORATION), on which 100 pieces of the member were aligned to give the feeding tape. A double-faced adhesive tape (a double-faced adhesive tape A) included in the member was used to place the member on the release liner. Next, the thus-produced feeding tape was fed to a mounter (YSM10 manufactured by Yamaha Motor Co., Ltd.) in an attempt to have the mounter to pick up the member from the feeding tape. A nozzle having a tip with an outer diameter of 2 mm and an inner diameter of 1 mm was used as a nozzle of the mounter, and the suction-holding pressure was 80 kPa or less at the time of pickup. Then, the suction-holding stability of the member was rated as excellent (A) when 90 or more of the 100 pieces of the member were picked up by a suction-holding portion of the suction-holding device without problem, as good (B) when 50 or more and 89 or less were picked up without problem, or as poor (C) when 49 or less were picked up without problem.

[Removal of Provisional Protective Film and Condition of Surface of Porous Membrane after Removal of Provisional Protective Film]

For each of the members produced in Examples 1 to 8, the provisional protective film was removed from the porous membrane and a surface (a surface that used to be joined with the porous membrane) of the removed provisional protective film was observed using an optical microscope at a 50-fold magnification. As a result of the observation, the condition of the above surface of the provisional protective film was rated as excellent (A) when adherence of a fiber of the porous membrane to the surface was not confirmed, and the condition of the above surface of the provisional protective film was rated as good (B) when adherence of a fiber of the porous membrane to the surface was confirmed. For the members of Examples 1 to 4 in which the provisional protective film and the porous membrane were joined to each other with a heat foaming adhesive, the provisional protective film 3 was spontaneously separated from the porous membrane 2 by heating each member at 120° C. For the members of Examples 5 and 6 in which the provisional protective film and the porous membrane were joined to each other with a UV-responsive adhesive, the provisional protective film 3 was separated by hand from the porous membrane 2 after each member was irradiated with an ultraviolet ray with a wavelength of 365 nm at an irradiation intensity of 300 mW/cm$^2$ to decrease the adhesive strength of the adhesive. The provisional protective film 3 was able to be separated smoothly from the porous membrane 2 with a very week force. For the member of Example 7 in which the provisional protective film 3 was an easily releasable tape, the provisional protective film 3 was able to be smoothly separated from the porous membrane 2 with a very week force without application of an external stimulus. For the member of Example 8 in which the provisional protective film 3 was an adhesive tape, the provisional protective film 3 was able to be separated from the porous membrane 2 without application of an external stimulus; however, a large force was needed for the separation, compared to the case of the members of Examples 5 to 7.

[Porous Membrane Protection Performance by Provisional Protective Film]

A feeding tape similar to those produced for the evaluation of the suction-holding stabilities of the members suction-held by the suction-holding device was produced and fed to a mounter (YSM10 manufactured by Yamaha Motor Co., Ltd.) to have the mounter to pick up the member from the feeding tape and fix the picked up member to a dummy board. A nozzle having a tip with an outer diameter of 2 mm and an inner diameter of 1 mm was used as a nozzle of the mounter, and the suction-holding pressure was 80 kPa or less at the time of pickup. The double-faced adhesive tape (the double-faced adhesive tape A) of the member was used to fix the member to the dummy board, a force applied to the member for fixation was 1 N, and the time during which the force was being applied to the member was 0.1 seconds. Subsequently, a surface (a surface that used to be joined with the provisional protective film) of the porous membrane from which the provisional protective film was removed was observed by optical microscopy at a 50-fold magnification for the members of Examples 1 to 8, and a surface of the porous membrane, the surface with which the nozzle of the mounter was brought into contact at the time of pickup, was observed by optical microscopy at a 50-fold magnification for the member of Comparative Example 1. As a result of observation, the protection performance was rated as excellent (A) when no dent or scar attributed to the nozzle of the mounter was confirmed on the above surface of the porous membrane, and the protection performance was rated as poor (C) when such a dent or scar was confirmed on the above surface of the porous membrane. The provisional protective films of the members of Examples 1 to 8 were removed by the method described in [Removal of provisional protective film and condition of surface of porous membrane after removal of provisional protective film].

Example 1

A porous PTFE membrane (TEMISH (registered trademark) NTF1131 manufactured by NITTO DENKO CORPORATION and having a circular shape with a thickness of 80 μm and a diameter of 2.0 mm) was prepared as the porous membrane 2. Separately, a thermoresponsive tape (No. 31935MS manufactured by NITTO DENKO CORPORATION and having a circular shape with a diameter of 2.0 mm) in which an adhesive layer (thickness: 75 μm) formed of a heat foaming adhesive was arranged on one surface of a substrate (thickness: 100 μm) was prepared as the provisional protective film 3. Additionally, No. 585 (having a ring shape with a thickness of 50 μm, an outer diameter or 2.0 mm, and an inner diameter of 1.0 mm) manufactured by NITTO DENKO CORPORATION was prepared as the double-faced adhesive tape A. Next, the provisional protective film 3 was joined to one surface of the porous membrane 2 with the above adhesive layer interposed therebetween, and the double-faced adhesive tape A was joined to the other surface. A member of Example 1 was thus obtained. The porous membrane 2, the provisional protective film 3, and the double-faced adhesive tape A were joined together such that their outer circumferences aligned with each other.

Example 2

A member of Example 2 was obtained in the same manner as in Example 1, except that a thermoresponsive tape (No. 3193MS manufactured by NITTO DENKO CORPORATION and having a circular shape with a diameter of 2.0 mm) in which an adhesive layer (thickness: 75 μm) formed of a heat foaming adhesive was arranged on one surface of a substrate (thickness: 100 μm) was used as the provisional protective film 3.

Example 3

A member of Example 3 was obtained in the same manner as in Example 1, except that a thermoresponsive tape (No. 3195MS manufactured by NITTO DENKO CORPORATION and having a circular shape with a diameter of 2.0 mm) in which an adhesive layer (thickness: 48 μm) formed of a heat foaming adhesive was arranged on one surface of a substrate (thickness: 100 μm) was used as the provisional protective film 3.

Example 4

A member of Example 4 was obtained in the same manner as in Example 1, except that a thermoresponsive tape (No. 3198MS manufactured by NITTO DENKO CORPORATION and having a circular shape with a diameter of 2.0 mm) in which an adhesive layer (thickness: 48 μm) formed of a heat foaming adhesive was arranged on one surface of a substrate (thickness: 100 μm) was used as the provisional protective film 3.

Example 5

A member of Example 5 was obtained in the same manner as in Example 1, except that a UV-responsive tape (UB-3083D manufactured by NITTO DENKO CORPORATION and having a circular shape with a diameter of 2.0 mm) in which an adhesive layer (thickness: 30 μm) formed of a UV-responsive adhesive was arranged on one surface of a substrate (thickness: 50 μm) was used as the provisional protective film 3.

Example 6

A member of Example 6 was obtained in the same manner as in Example 1, except that a UV-responsive tape (DU-300 manufactured by NITTO DENKO CORPORATION and having a circular shape with a diameter of 2.0 mm) in which an adhesive layer (thickness: 5 μm) formed of a UV-responsive adhesive was arranged on one surface of a substrate (thickness: 80 μm) was used as the provisional protective film 3.

Example 7

A member of Example 7 was obtained in the same manner as in Example 1, except that an easily releasable tape (AW303D manufactured by NITTO DENKO CORPORATION and having a circular shape with a diameter of 2.0 mm) in which an adhesive layer (thickness: 12 μm) formed of a urethane adhesive was arranged on one surface of a PET substrate (thickness: 38 μm) was used as the provisional protective film 3.

Example 8

A member of Example 8 was obtained in the same manner as in Example 1, except that an adhesive tape (No. 336 manufactured by NITTO DENKO CORPORATION and having a circular shape with a diameter of 2.0 mm) in which an adhesive layer (thickness: 30 μm) formed of a silicone adhesive was arranged on one surface of a PET substrate (thickness: 50 μm) was used as the provisional protective film 3.

Comparative Example 1

A member of Comparative Example 1 was obtained in the same manner as in Example 1, except that the provisional protective film 3 was not joined.

Table 1 below shows the evaluation results for the members produced in Examples 1 to 8 and Comparative Example 1.

TABLE 1

| | Provisional protective layer | Initial adhesive strength (N/25 mm) | Post-response adhesive strength (N/25 mm) | Pick-up property | Surface condition | Protection performance |
|---|---|---|---|---|---|---|
| Example 1 | Thermoresponsive tape | 0.49 | 0 (spontaneous separation) | A | A | A |
| Example 2 | Thermoresponsive tape | 0.56 | 0 (spontaneous separation) | A | A | A |

TABLE 1-continued

|  | Provisional protective layer | Initial adhesive strength (N/25 mm) | Post-response adhesive strength (N/25 mm) | Pick-up property | Surface condition | Protection performance |
| --- | --- | --- | --- | --- | --- | --- |
| Example 3 | Thermoresponsive tape | 0.38 | 0 (spontaneous separation) | A | A | A |
| Example 4 | Thermoresponsive tape | 0.14 | 0 (spontaneous separation) | A | A | A |
| Example 5 | UV-responsive tape | 0.34 | 0.17 | A | A | A |
| Example 6 | UV-responsive tape | 0.59 | 0.42 | A | A | A |
| Example 7 | Easily releasable tape | 0.12 | — | B | A | A |
| Example 8 | Adhesive tape | 1.40 | — | A | B | A |
| Comparative Example 1 | N/A | — | — | B | — | C |

INDUSTRIAL APPLICABILITY

Since the member according to the present invention for a ventilation hole is to be placed on a housing to cover a ventilation hole of the housing, passage of gas between the outside and the inside of the housing through the ventilation hole can be allowed and dust and/or a liquid can be prevented from entering the inside of the housing from the outside thereof through the ventilation hole.

The invention claimed is:

1. A member for a ventilation hole, the member to be placed to cover a ventilation hole in order to allow passage of gas between an outside and an inside of a housing through the ventilation hole of the housing and prevent dust and/or a liquid from entering the inside from the outside through the ventilation hole, the member comprising:
   a porous membrane having air permeability in a thickness direction; and
   a provisional protective film joined to the porous membrane to cover the porous membrane from the outside side, wherein
   the provisional protective film is air-impermeable in a thickness direction or has lower air permeability in the thickness direction than the air permeability of the porous membrane,
   the provisional protective film and the porous membrane are joined to each other in such a manner that the provisional protective film is removable from the porous membrane,
   wherein the provisional protective film is joined to the porous membrane with an adhesive whose adhesive strength decreases by an external stimulus, and
   wherein the external stimulus is heat and/or light.

2. The member according to claim 1, wherein the provisional protective film is formed of a material that deforms or deteriorates by the external stimulus or by providing a solvent.

3. The member according to claim 1, wherein the provisional protective film includes a joined portion joined to the porous membrane and a tab portion protruding outward from a peripheral edge of the joined portion.

4. The member according to claim 1, wherein the provisional protective film is air-impermeable in the thickness direction.

5. The member according to claim 1, wherein the porous membrane has an area of 100 mm$^2$ or less.

6. The member according to claim 1, wherein the porous membrane includes a porous polytetrafluoroethylene membrane.

7. The member according to claim 1, further comprising an adhesive layer joined to the porous membrane from the inside side.

8. The member according to claim 7, wherein the adhesive layer is a substrate-less double-faced adhesive tape.

9. The member according to claim 7, wherein the adhesive layer is a double-faced adhesive tape including a substrate formed of a heat-resistant resin including at least one selected from a polyimide, a polyester, a polyetheretherketone, a polyamide-imide, and a fluorine resin.

10. A method for manufacturing an electronic device, the electronic device comprising: a housing including a ventilation hole; and the member for the ventilation hole according to claim 1, the method comprising:
    transferring the member by a suction-holding device with a suction-holding portion of the suction-holding device in contact with the provisional protective film to a position where the member covers the ventilation hole of the housing; and
    removing the provisional protective film from the porous membrane after the transferring.

11. A tape for feeding the member for the ventilation hole, the tape comprising:
    a substrate tape; and
    a plurality of pieces of the member for the ventilation hole according to claim 1, the pieces being placed on a surface of the substrate tape.

* * * * *